(12) United States Patent  (10) Patent No.: US 8,062,932 B2
Hébert et al.  (45) Date of Patent: Nov. 22, 2011

(54) COMPACT SEMICONDUCTOR PACKAGE WITH INTEGRATED BYPASS CAPACITOR AND METHOD

(75) Inventors: François Hébert, San Mateo, CA (US); Kai Liu, Mountain View, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 404 days.

(21) Appl. No.: 12/330,381

(22) Filed: Dec. 8, 2008

(65) Prior Publication Data

US 2010/0133674 A1 Jun. 3, 2010

Related U.S. Application Data

(63) Continuation-in-part of application No. 12/326,065, filed on Dec. 1, 2008.

(51) Int. Cl.
*H01L 21/00* (2006.01)
*H01L 21/70* (2006.01)
(52) U.S. Cl. ........................................ 438/121; 257/502
(58) Field of Classification Search .................. 257/502, 257/723, 666, 676; 438/121–123
See application file for complete search history.

(56) References Cited

U.S. PATENT DOCUMENTS 6,919,644 B2 * 7/2005 Uchida .......................... 257/784
7,776,658 B2 * 8/2010 Liu et al. ........................ 438/121

* cited by examiner

*Primary Examiner* — Calvin Lee
(74) *Attorney, Agent, or Firm* — Chein-Hwa Tsao; C H Emily LLC (57) ABSTRACT

A top-side cooled compact semiconductor package with integrated bypass capacitor is disclosed. The top-side cooled compact semiconductor package includes a circuit substrate with terminal leads, numerous semiconductor dies bonded atop the circuit substrate, numerous elevation-adaptive interconnection plates for bonding and interconnecting top contact areas of the semiconductor dies with the circuit substrate, a first member of the elevation-adaptive interconnection plates has a first flat-top area and a second member of the elevation-adaptive interconnection plates has a second flat-top area in level with the first flat-top area, a bypass capacitor, having two capacitor terminals located at its ends, stacked atop the two interconnection plate members while being bonded thereto via the first flat-top area and the second flat-top area for a reduced interconnection parasitic impedance.

4 Claims, 10 Drawing Sheets

Fig. 5

COMPACT SEMICONDUCTOR PACKAGE WITH INTEGRATED BYPASS CAPACITOR AND METHOD

CROSS REFERENCE TO RELATED APPLICATIONS

This application is a continuation in part (CIP) application of the following commonly assigned US patent application:
U.S. patent application Ser. No. 12/326,065 filed Dec. 1, 2008, entitled "Top-side Cooled Semiconductor Package with Stacked Interconnection Plates and Method" by Kai Liu et al, hereafter referred to as U.S. application Ser. No. 12/326,065
whose content is incorporated herein by reference for any and all purposes.

FIELD OF INVENTION

This invention relates generally to the field of electronic system packaging. More specifically, the present invention is directed to the physical level packaging of semiconductor dies.

BACKGROUND OF THE INVENTION

Owing to their high integration density, extremely low quiescent leakage current and ever improving power handling capacity, power MOSFETs continue their popular adoption in power electronics such as switching power supplies and converters. Some of the highly important attributes of power MOSFETs are their continuously increasing degree of integration, shrinking package size and accompanying increased required heat dissipation driven by the consumer market.

The following lists some relevant prior arts already reviewed by U.S. application Ser. No. 12/326,065:
"DirectFET" approach (U.S. Pat. No. 6,624,522, U.S. Pat. No. 7,285,866 and U.S. Patent Application Publication 2007/0284722)
U.S. Pat. No. 6,777,800 entitled "Semiconductor die package including drain clip"
Commonly assigned U.S. application Ser. No. 11/799,467 entitled "SEMICONDUCTOR PACKAGE HAVING DIMPLED PLATE INTERCONNECTIONS"
U.S. Pat. No. 6,249,041 entitled "IC chip package with directly connected leads"
U.S. Pat. No. 4,935,803 entitled "Self-centering electrode for power devices"
Commonly assigned US Patent Application Publication 20080087992 entitled "Semiconductor package having a bridged plate interconnection"
Commonly assigned U.S. patent application Ser. No. 12/130,663 entitled "CONDUCTIVE CLIP FOR SEMICONDUCTOR DEVICE PACKAGE"
Commonly assigned U.S. patent application Ser. No. 12/237,953 entitled "Top Exposed Clip with Window Array"

Figure 1:
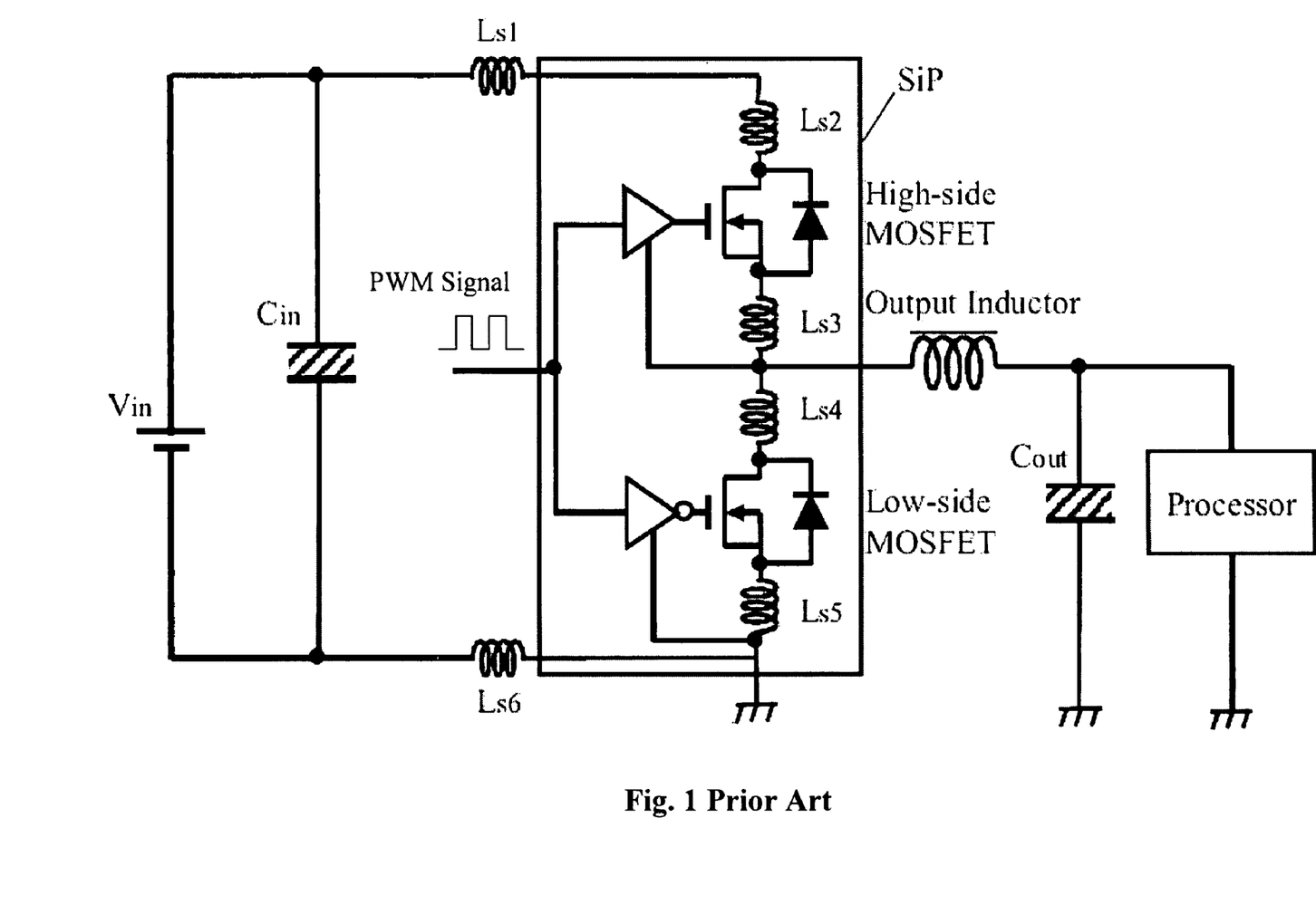
FIG. 1 is a one-phase voltage regulator circuit, including an SiP having high-side and low-side MOSFETs and a driver IC, of a prior art IEEE paper.

In a paper entitled "System in Package with Mounted Capacitor for Reduced Parasitic Inductance in Voltage Regulators" by T. Hashimoto et al, published in IEEE Proceedings of the 20th International Symposium on Power Semiconductor Devices & IC's, May 18-22, 2008 Orlando, Fla. pp. 315-318, a developed system in package (SiP) is described on which an input capacitor is mounted for voltage regulators (VR). For convenience of description, this paper is referred to hereinafter as "IEEE paper". A one-phase VR circuit including parasitic inductance (Ls1-Ls6) and an SiP, which has high-side and low-side MOSFETs and a driver IC, of the IEEE paper is reproduced here as FIG. 1. Correspondingly, two schematic cross-sections of SiPs on a printed circuit board (PCB) are reproduced in FIG. 1A and FIG. 1B.

Figure 1A:
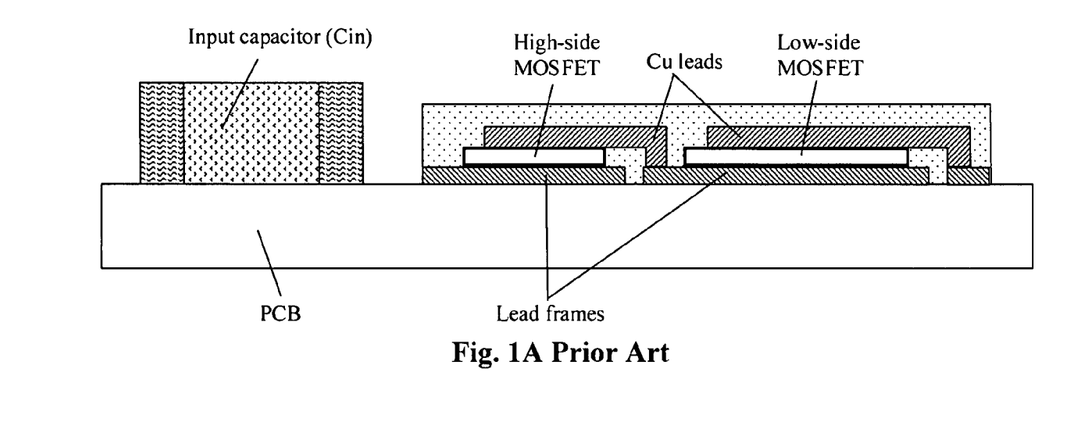
FIG. 1A and FIG. 1B are two corresponding schematic cross-sections of SiPs on a printed circuit board extracted from the prior art IEEE paper.
Figure 1B:
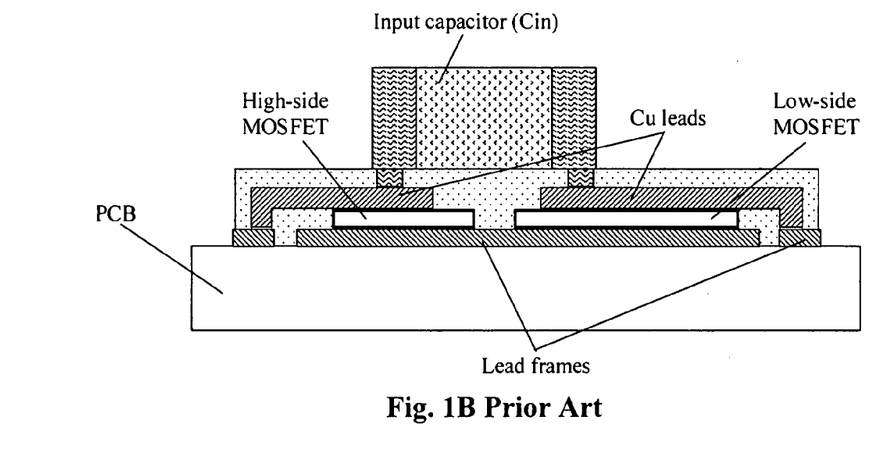

In the SiP shown in FIG. 1A, the input capacitor is mounted on the PCB, and the MOSFETs are bonded to the lead frames with Cu leads. The calculated parasitic inductance of the SiP is 0.87 nH due to the parasitic inductances from Cin to the SiP (Ls1 and Ls6 shown in FIG. 1). In the improved SiP with a mounted input capacitor of FIG. 1B, the parasitic inductance is reduced by more than 50% (from 0.87 to 0.39 nH) because of a small loop from Cin to the SiP. The upper electrodes of MOSFETs (i.e. drain electrode of the high-side MOSFET and source electrode of the low-side MOSFET) are connected to the lead frames with Cu leads, on which Cin is mounted. High-side and low-side MOSFETs are mounted on the same lead frame, which connects to the output inductor. The high-side MOSFET die is flipped so that its drain electrode faces up, facilitating connection of the drain electrode to the positive terminal of Cin. Another advantage of the improved SiP of FIG. 1B comes from its lower equivalent series resistance (ESR) of the mounted capacitor that enables the reduction of capacitor loss from its resonant current.

Thus, the packaging concept as presented in the IEEE paper is based upon using FLIP-CHIP of standard BOTTOM DRAIN MOSFET dies. Copper leads are used for connecting the top of the MOSFET dies to lead frames. From the photograph of the IEEE paper, the construction details on how the Input Capacitor Cin is mounted on top of the SiP are limited although there is no evidence that the SiP is top exposed outside of the small contact openings made for Cin to increase top-side heat dissipation. Another observation is that the SiP of the IEEE paper does not top expose large areas above the High-side and Low-side MOSFET dies other than the ends of Cin.

In view of the above described prior arts, therefore, it remains highly desirable to further reduce the size of power semiconductor device SiP with an integrated input capacitor while reducing its packaging parasitic inductance and resistance, reducing ESR of its input capacitor and lowering its packaging thermal resistance.

SUMMARY OF THE INVENTION

A compact semiconductor package with integrated bypass capacitor is proposed. The compact semiconductor package includes:
  A circuit substrate having numerous terminal leads for external electrical connection.
  A number of semiconductor dies whose bottom surfaces are bonded atop the circuit substrate.
  A number of elevation-adaptive interconnection plates for bonding and interconnecting the top contact area of each of the semiconductor dies with the circuit substrate while being three dimensionally formed to accommodate for elevation difference between the top contact area and the circuit substrate thus electrically connecting the top contact area with the terminal leads.
  A first member of the elevation-adaptive interconnection plates has a first flat-top area and a second member of the elevation-adaptive interconnection plates has a second flat-top area in level with the first flat-top area.
  A bypass capacitor, having two end capacitor terminals, stacked atop the two interconnection plate members while being bonded thereto via the first flat-top area and the second flat-top area.

The two end capacitor terminals, which may be located at opposite ends of capacitor, may have a wrap-around design, or may be located only on the bottom surface of the capacitor.

As a substantial structural variation, the number of elevation-adaptive interconnection plates are divided into:

A first number of low thermal resistance intimate interconnection plates for bonding and interconnecting the top contact area of the semiconductor dies with the circuit substrate.

A second number of low thermal resistance stacked interconnection plates, each stacked and bonded atop a selected number of the intimate interconnection plates, for adding effective top-side cooling to the compact semiconductor package and/or for optimizing connection to the bypass capacitor.

As a structural refinement, the compact semiconductor package includes a molding encapsulant for encapsulating most of the semiconductor package except for exposing a top surface of the flat-top areas. Alternatively, the molding encapsulant may encapsulate most of the semiconductor package except for exposing a top surface of the bypass capacitor to maintain effective top-side cooling through it.

As a structural improvement, the top portion of at least one stacked interconnection plates includes a peripheral overhang above its correspondingly bonded intimate interconnection plates. The peripheral overhang allows for a maximized top surface area of the stacked interconnection plates for heat dissipation independent of otherwise areal constraints applicable to the intimate interconnection plates below. By the same token, each intimate interconnection plate can be shaped and sized, independently of the amount of top surface of its corresponding stacked interconnection plate, to maximize its corresponding bonding areas on the semiconductor dies thus reducing their associated spreading resistance. The peripheral overhang can be created by partially etching a stacked interconnection plate at its underside. Alternatively, the peripheral overhang can be created by three dimensionally forming a stacked interconnection plate.

As a refined embodiment, either an intimate interconnection plate or a stacked interconnection plate can include numerous locking tabs placed in intermeshing relationship with a corresponding number of terminal leads nearby to minimize rotational creepage of the semiconductor dies during a packaging process for the semiconductor package.

As an embodiment, the circuit substrate can be a leadframe having conductive die pads for bonding the number of semiconductor dies. Alternatively, the circuit substrate can be a laminated circuit having numerous thermal vias to increase bottom-side cooling.

As a more specific embodiment, the number of semiconductor dies include a bottom source high-side (BSHS) MOSFET and a low-side (LS) MOSFET which, together with the bypass capacitor, are all components of a power-conversion circuit output stage.

An alternative compact semiconductor package with integrated bypass capacitor is proposed. The alternative compact semiconductor package includes:

A circuit substrate having a first number of terminal leads for external electrical connection.

A first number of elevation-adaptive interconnection plates for bonding the top contact area of the semiconductor dies and forming a second number of terminal leads for external electrical connection while being three dimensionally formed to accommodate for elevation difference between the top contact area and the second number of terminal leads.

A first member of the first number of elevation-adaptive interconnection plates has a first flat-top area and a second member of the first number of elevation-adaptive interconnection plates has a second flat-top area in level with the first flat-top area.

a bypass capacitor, having two end capacitor terminals, stacked atop the two interconnection plate members while being bonded thereto via the first flat-top area and the second flat-top area.

A method of packaging a semiconductor package having a bypass capacitor plus a number of semiconductor dies interconnected with numerous elevation-adaptive intimate interconnection plates and elevation-adaptive stacked interconnection plates is proposed. The method includes:

a) Providing a circuit substrate having numerous terminal leads for external electrical connection.

b) Providing the semiconductor dies and attaching them atop the circuit substrate.

c) Providing and attaching numerous intimate interconnection plates to the top contact areas of the semiconductor dies and the circuit substrate for electrical connection between the top contact areas and the terminal leads.

d) Providing and attaching numerous stacked interconnection plates atop a selected number of intimate interconnection plates while insuring that a first member of the stacked interconnection plates has a first flat-top area and a second member of the stacked interconnection plates has a second flat-top area in level with the first flat-top area.

e) Molding an encapsulant over the package in progress.

f) Removing a top portion of the molding encapsulant till the top surfaces of the first flat-top area and the second flat-top area are exposed.

g) Providing a bypass capacitor having two ends capacitor terminals located at its ends, stacking then bonding the bypass capacitor atop the two stacked interconnection plate members via the first flat-top area and the second flat-top area.

As a variation in the packaging method, the above steps e) and f) can be replaced by:

e) Placing a detachable mask over the top surfaces of the first flat-top area and the second flat-top area.

f) Molding an encapsulant over the package in progress then removing the detachable mask from the package in progress to expose the top surfaces of the first flat-top area and the second flat-top area.

As another variation in the packaging method, the above steps e), f), and g) can be replaced by:

e) Providing a bypass capacitor having two end capacitor terminals located at its ends, stacking then bonding the bypass capacitor atop the two stacked interconnection plate members via the first flat-top area and the second flat-top area.

f) Molding an encapsulant over the package in progress.

g) Optionally, Removing a top portion of the molding encapsulant till the top surface of the bypass capacitor is exposed.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

Figure 2:
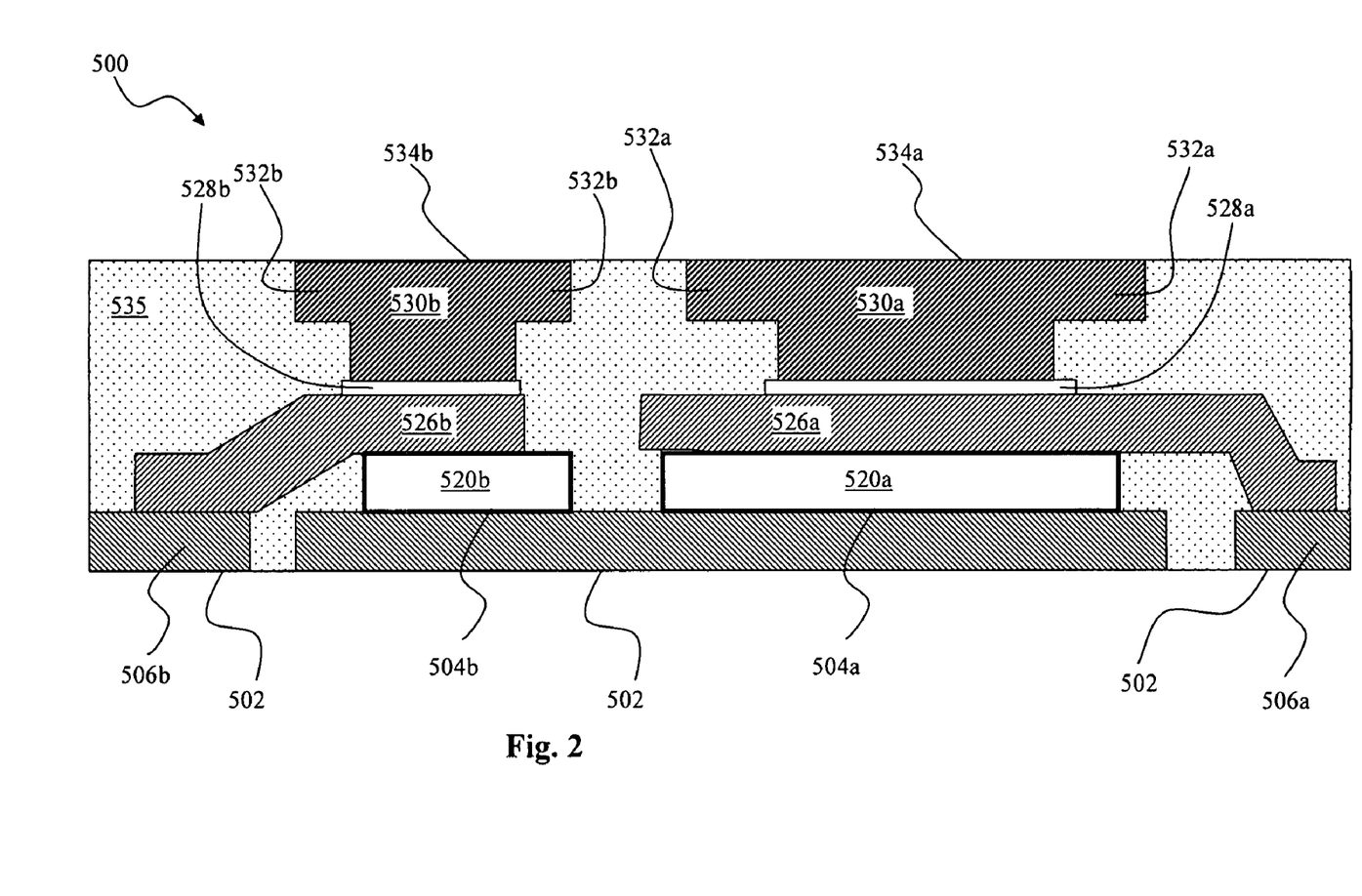
FIG. 2 illustrates a first partial semiconductor package of the present invention including two semiconductor dies atop a leadframe.

FIG. 2 illustrates a first partial semiconductor package 500 of the present invention including a semiconductor die one 520a and a semiconductor die two 520b. The first partial semiconductor package 500 includes:

A circuit substrate, in this case a leadframe 502, having numerous terminal leads 506a and terminal leads 506b for making external electrical connection.

The bottom surfaces of semiconductor die one 520a and semiconductor die two 520b are bonded atop the leadframe 502 via its die pad one 504a and die pad two 504b respectively. Alternatively, the two semiconductor dies 520a and 520b may sit atop a single die pad accommodating both dies.

A low thermal and electrical resistance intimate interconnection plate one 526a for bonding and interconnecting the top contact area of semiconductor die one 520a with the leadframe 502 while being three dimensionally formed to accommodate for elevation difference between them thus electrically connecting the top contact area of semiconductor die one 520a with terminal leads 506a. Similarly, a low thermal and electrical resistance intimate interconnection plate two 526b for bonding and interconnecting the top contact area of semiconductor die two 520b with the leadframe 502 while being three dimensionally formed to accommodate for elevation difference between them thus electrically connecting the top contact area of semiconductor die two 520b with terminal leads 506b.

A low thermal resistance stacked interconnection plate one 530a, stacked and bonded atop the intimate interconnection plate one 526a with solder 528a or a similar material, for adding effective top-side cooling to the partial semiconductor package 500. Similarly, a low thermal resistance stacked interconnection plate two 530b, stacked and bonded atop the intimate interconnection plate two 526b with solder 528b, for adding effective top-side cooling to the partial semiconductor package 500. Notice that the stacked interconnection plate one 530a has a first flat-top area 534a and the stacked interconnection plate two 530b has a second flat-top area 534b that is in level with the first flat-top area 534a. Notice also that the top portion of stacked interconnection plate one 530a has an underside partially etched peripheral overhang 532a that is located above the intimate interconnection plate one 526a and the top portion of stacked interconnection plate two 530b has an underside partially etched peripheral overhang 532b that is located above the intimate interconnection plate two 526b. As a design variation, the peripheral overhang can instead be created by three dimensionally forming a stacked interconnection plate. As was elucidated in U.S. application Ser. No. 12/326,065, the combination of intimate interconnection plate and stacked interconnection plate with the stacked interconnection plate having peripheral overhangs allows for a maximized exposed flat-top areas for heat dissipation independent of otherwise areal constraints applicable to the intimate interconnection plate below. It also follows that this combination can offer minimized die-to-terminal leads electrical resistance and die-to-ambient thermal resistance at the same time in the presence of increased number of top side die electrodes and plate features of lower elevation. In accordance with one embodiment of the invention, a molding encapsulant 535 may cover most of the partial semiconductor package, but leave the first and second flat-top areas 534a and 534b exposed. By way of example semiconductor die one 520a may be a low-side (LS) MOSFET, and semiconductor die two 520b may be a high-side (HS) MOSFET.

FIG. 3A through FIG. 3D illustrate four additional partial semiconductor packages 600, 700, 800 and 900 of the present invention each including two semiconductor dies atop a leadframe. The partial semiconductor package 600 of FIG. 3A packages semiconductor die one 620a and semiconductor die two 620b atop a leadframe 602. An intimate interconnection plate one 626a and a stacked interconnection plate one 630a are employed to interconnect bulk of the top contact area of semiconductor die one 620a with a terminal lead 606b of the leadframe 602. An intimate interconnection plate two 626b and a stacked interconnection plate two 630b are employed to interconnect the top contact area of semiconductor die two 620b with terminal leads 606f, 606g and 606h of the leadframe 602. Additionally, an additional interconnection plate 626c is employed to interconnect a small portion of the top contact area of semiconductor die one 620a with a terminal lead 606a of the leadframe 602. An example of the small portion of the top contact area is a top-side gate contact of a MOSFET semiconductor die, in which case the additional interconnection plate 626c is a gate clip. A bonding wire 622b is employed to interconnect a small portion of the top contact area of semiconductor die two 620b to a lead 606e of the leadframe 602. Notice that the stacked interconnection plate one 630a has a first flat-top area 634a and the stacked interconnection plate two 630b has a second flat-top area 634b that is in level with the first flat-top area 634a.

Figure 3A:
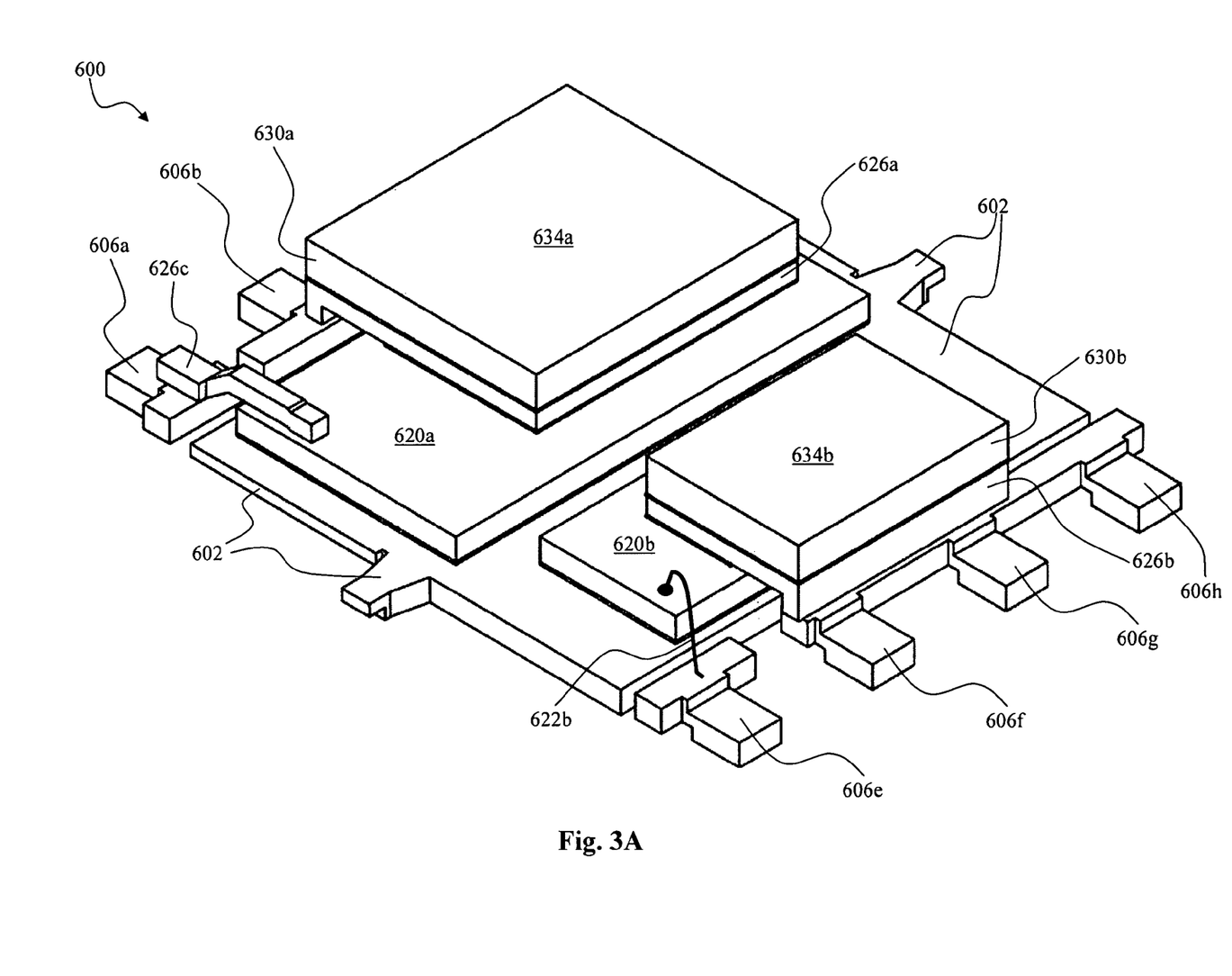
FIG. 3A through FIG. 3D illustrate four additional partial semiconductor packages of the present invention each including two semiconductor dies atop a leadframe.
Figure 3B:
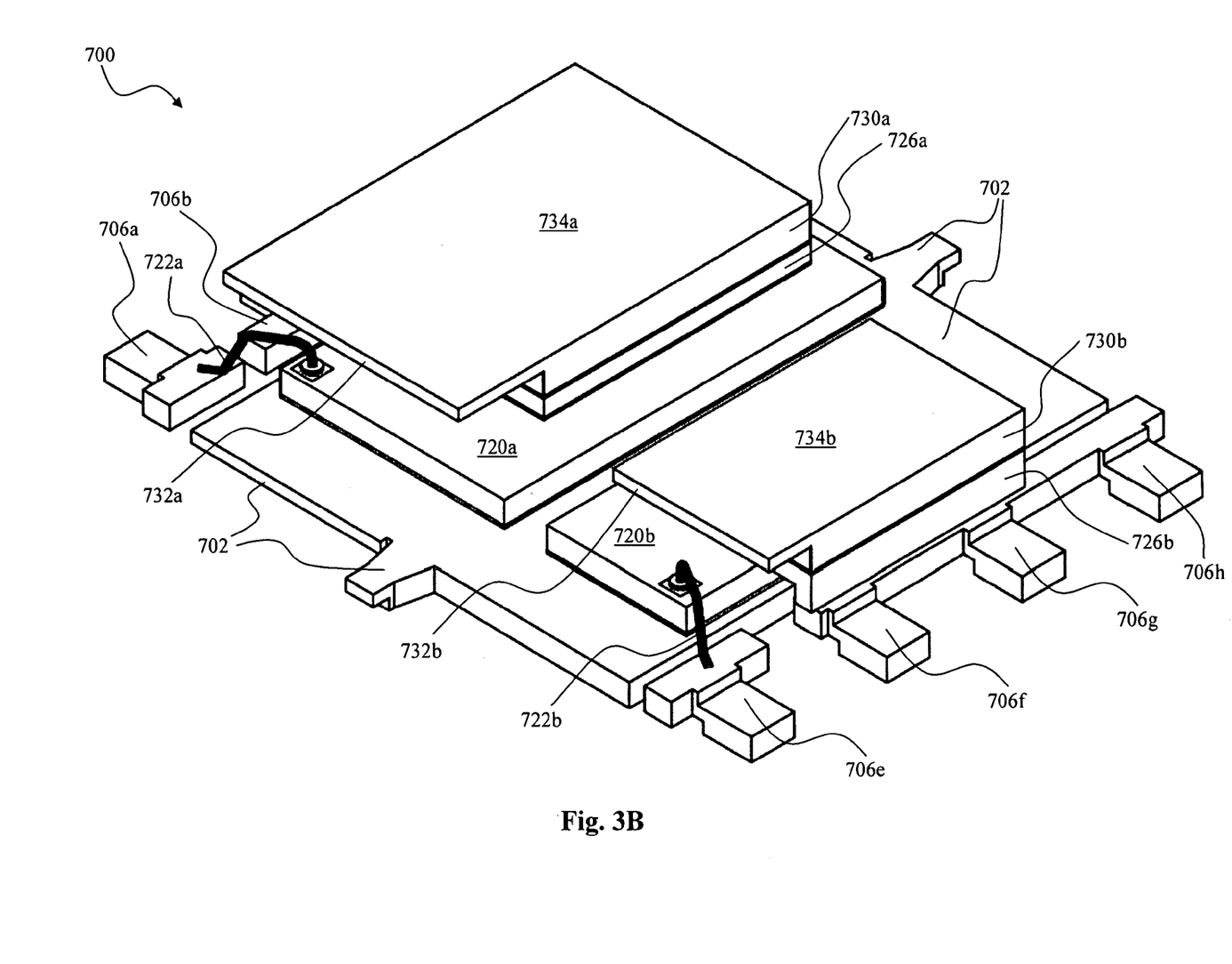

The partial semiconductor package 700 of FIG. 3B packages semiconductor die one 720a and semiconductor die two 720b atop a leadframe 702. An intimate interconnection plate one 726a and a stacked interconnection plate one 730a are employed to interconnect bulk of the top contact area of semiconductor die one 720a with a terminal lead 706b of the leadframe 702. An intimate interconnection plate two 726b and a stacked interconnection plate two 730b are employed to interconnect bulk of the top contact area of semiconductor die two 720b with terminal leads 706f, 706g and 706h of the leadframe 702. Additionally, a bond wire one 722a is employed to interconnect a small portion of the top contact area of semiconductor die one 720a with a terminal lead 706a of the leadframe 702 and a bond wire two 722b is employed to interconnect a small portion of the top contact area of semiconductor die two 720b with a terminal lead 706e of the leadframe 702. Notice that the stacked interconnection plate one 730a has a first flat-top area 734a and the stacked interconnection plate two 730b has a second flat-top area 734b that is in level with the first flat-top area 734a. Notice also that the stacked interconnection plate one 730a has an underside partially etched peripheral overhang 732a and the stacked interconnection plate two 730b has an underside partially etched peripheral overhang 732b, which can accommodate features such as bonding wires one and two 722a, 722b.

Figure 3C:
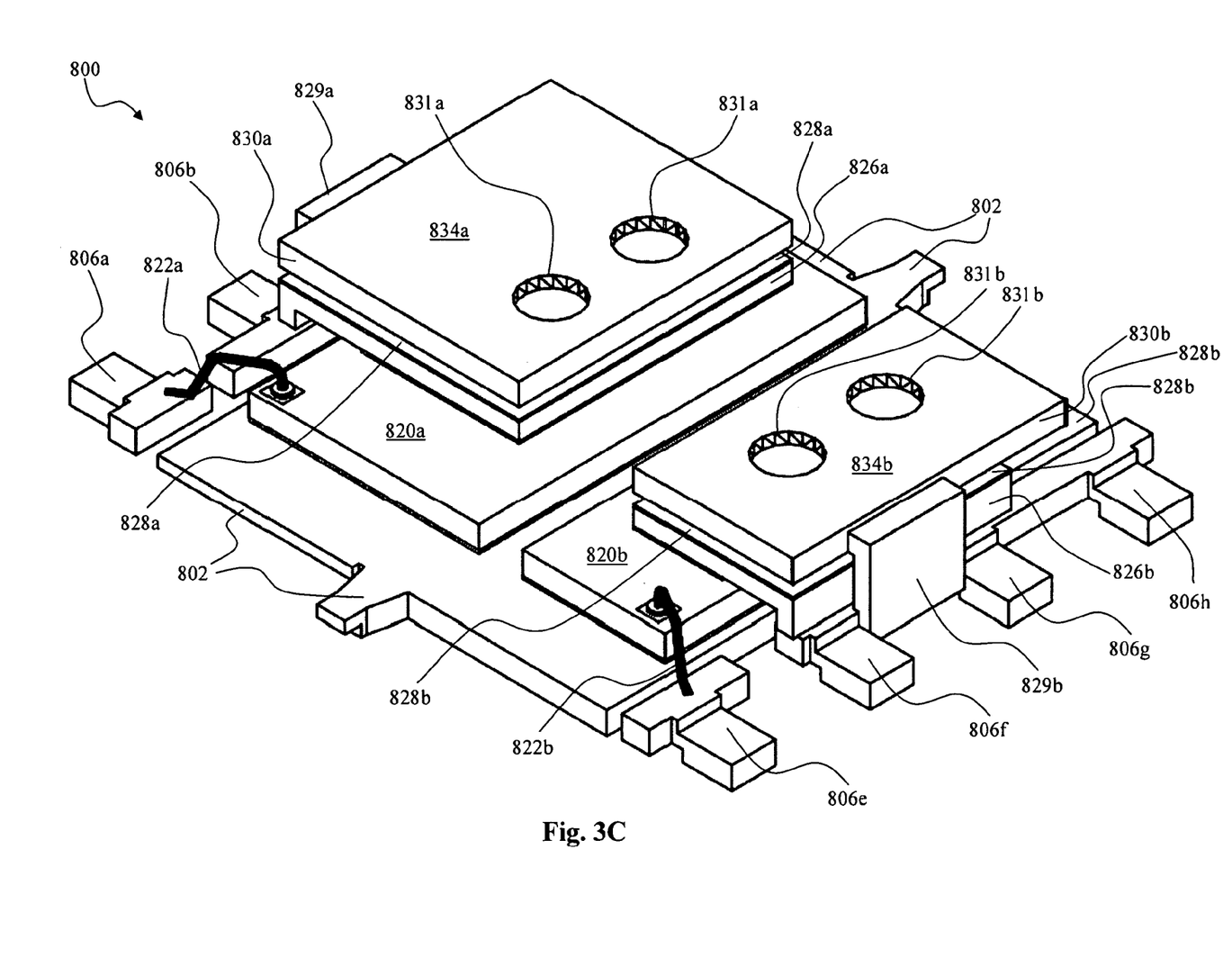

The partial semiconductor package 800 of FIG. 3C packages semiconductor die one 820a and semiconductor die two 820b atop a leadframe 802. An intimate interconnection plate one 826a and a stacked interconnection plate one 830a are employed to interconnect bulk of the top contact area of semiconductor die one 820a with a terminal lead 806b of the leadframe 802. An intimate interconnection plate two 826b and a stacked interconnection plate two 830b are employed to interconnect bulk of the top contact area of semiconductor die two 820b with terminal leads 806f, 806g and 806h of the leadframe 802. Additionally, a bond wire one 822a is employed to interconnect a small portion of the top contact area of semiconductor die one 820a with a terminal lead 806a of the leadframe 802 and a bond wire two 822b is employed to interconnect a small portion of the top contact area of semiconductor die two 820b with a terminal lead 806e of the leadframe 802. Notice first that the stacked interconnection plate one 830a has a first flat-top area 834a and the stacked interconnection plate two 830b has a second flat-top area 834b that is in level with the first flat-top area 834a. Secondly, the stacked interconnection plate one 830a and the stacked interconnection plate two 830b have top dimples 831a and 831b respectively for locking to bottom dimples (not shown) on the intimate interconnection plates one and two 826a and 826b, which serve to reduce related bonding stress and improving related bonding agent flow. As a side remark, other features of lower elevation such as anchor holes, out-of-plane conductive bridges between fingers and windows described in U.S. application Ser. No. 12/326,065 can be added to any or all of the stacked interconnection plates as well. Thirdly, the stacked interconnection plate two 830b has a locking tab 829b that is located and sized such that, upon bonding of the stacked interconnection plate two 830b onto the intimate interconnection plate two 826b, it is placed in intermeshing relationship with corresponding terminal leads 806f and 806g nearby to minimize rotational creepage of semiconductor die two 820b and the intimate interconnection plate two 826b during a packaging process for the partial semiconductor package 800. Stacked interconnection plate one 830a has a similar locking tab 829a. Fourthly, the top area of stacked interconnection plate one 830a and stacked interconnection plate two 830b are purposely made to be respectively slightly smaller than that of intimate interconnection plate one 826a and intimate interconnection plate two 826b so as to create a number of ledges 828a and 828b. Upon later sealing of the partial semiconductor package 800 with a molding encapsulant, these ledges 828a and 828b will function to strengthen the locking of the molding encapsulant onto the partial semiconductor package 800.

Figure 3D:
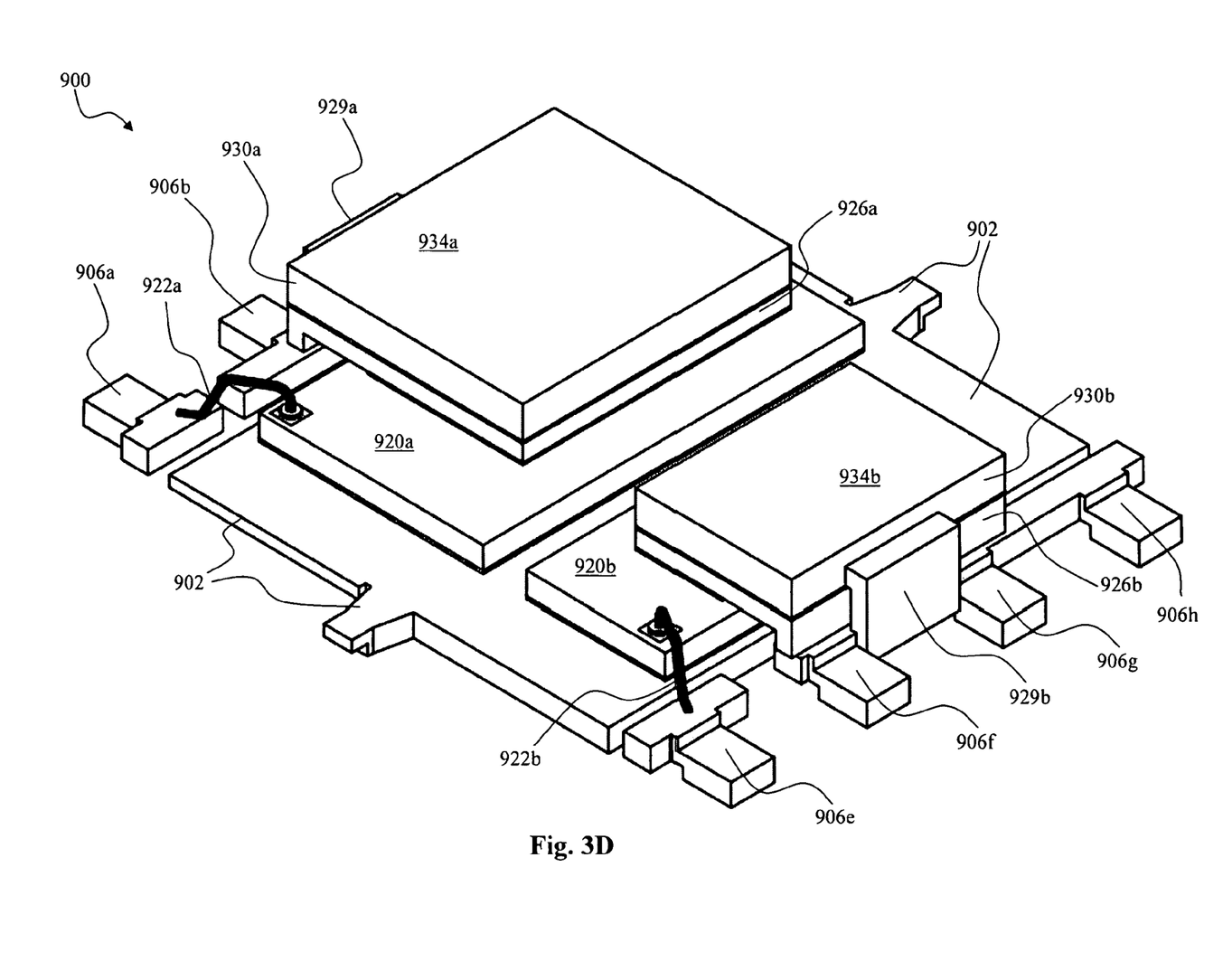

The partial semiconductor package 900 of FIG. 3D packages semiconductor die one 920a and semiconductor die two 920b atop a leadframe 902. An intimate interconnection plate one 926a and a stacked interconnection plate one 930a are employed to interconnect bulk of the top contact area of semiconductor die one 920a with a terminal lead 906b of the leadframe 902. An intimate interconnection plate two 926b and a stacked interconnection plate two 930b are employed to interconnect bulk of the top contact area of semiconductor die two 920b with terminal leads 906f, 906g and 906h of the leadframe 902. Additionally, a bond wire one 922a is employed to interconnect a small portion of the top contact area of semiconductor die one 920a with a terminal lead 906a of the leadframe 902 and a bond wire two 922b is employed to interconnect a small portion of the top contact area of semiconductor die two 920b with a terminal lead 906e of the leadframe 902. Notice that the stacked interconnection plate one 930a has a first flat-top area 934a and the stacked interconnection plate two 930b has a second flat-top area 934b that is in level with the first flat-top area 934a. Additionally, the stacked interconnection plate two 930b has a locking tab 929b that is located and sized such that, upon bonding of the stacked interconnection plate two 930b onto the intimate interconnection plate two 926b, it is placed in intermeshing relationship with corresponding terminal leads 906f and 906g nearby to minimize rotational creepage of semiconductor die two 920b and the intimate interconnection plate two 926b during a packaging process for the partial semiconductor package 900. Similarly, stacked interconnection plate one 930a has a locking tab 929a.

Figure 4A:
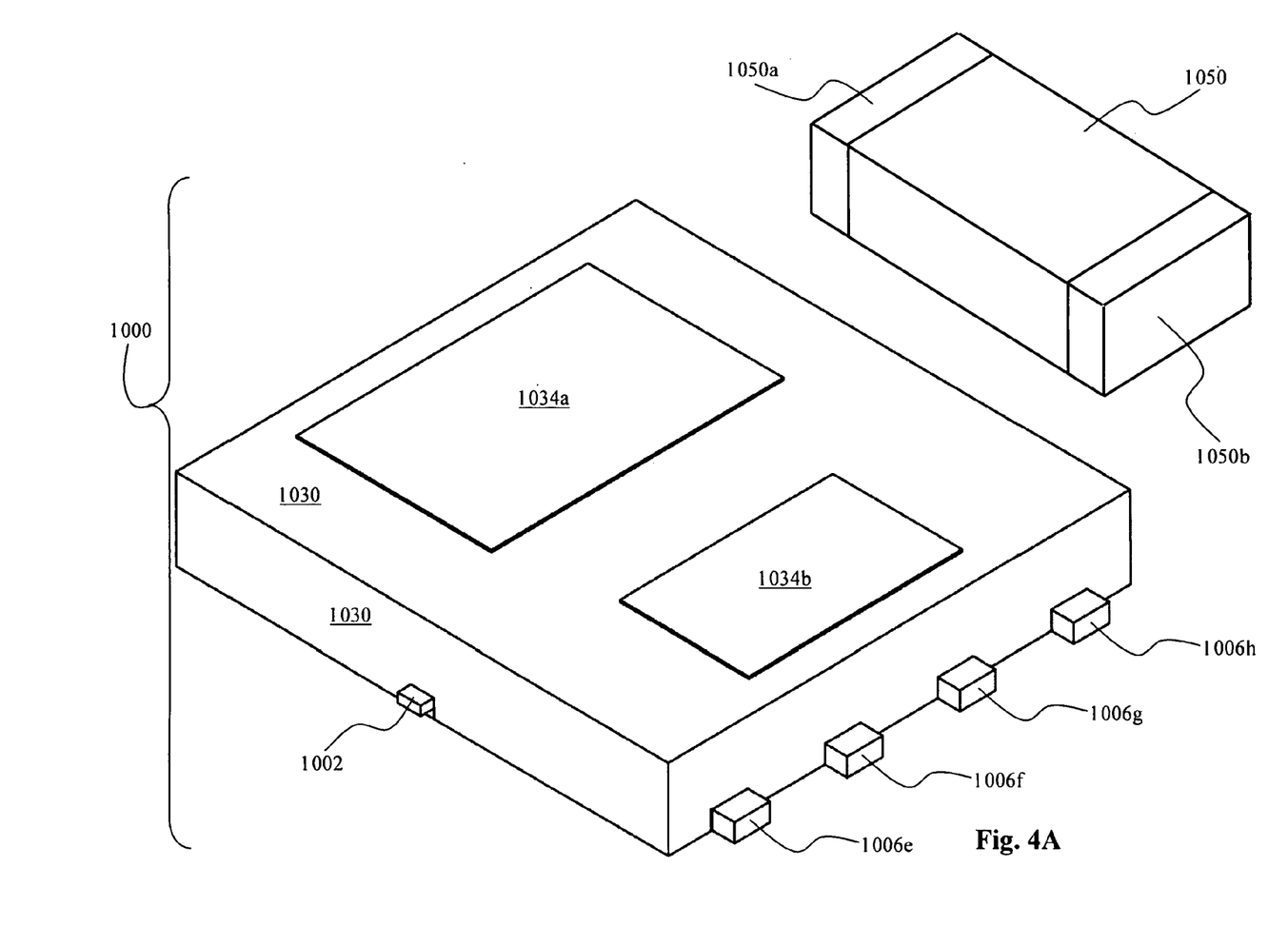
FIG. 4A and FIG. 4B illustrate the completion of a compact semiconductor package of the present invention with a molding encapsulant.
Figure 4B:
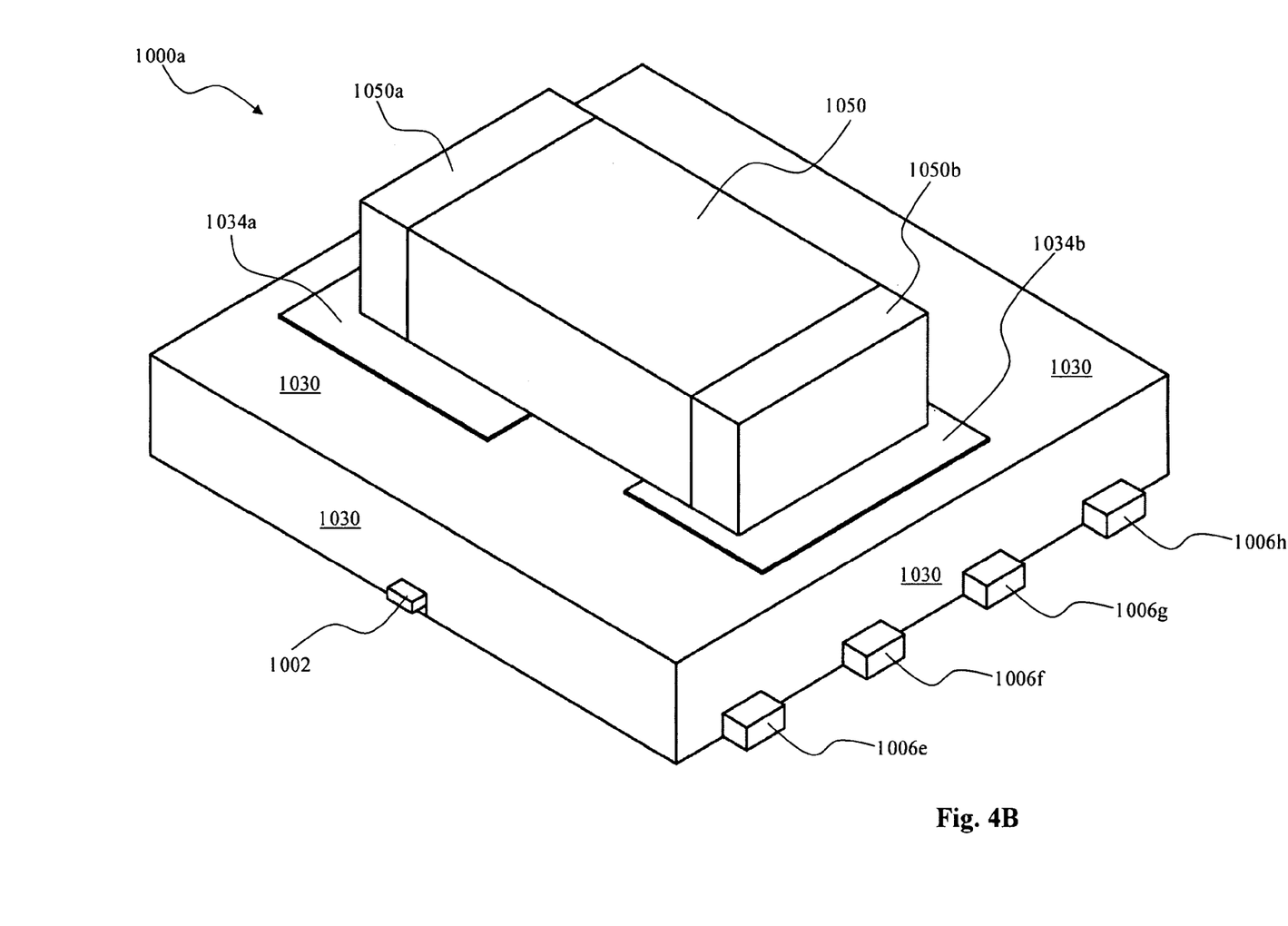

FIG. 4A and FIG. 4B illustrate the completion of a compact semiconductor package 1000a of the present invention with a molding encapsulant 1030. In FIG. 4A a partial semiconductor package 1000 has been made by molding a molding encapsulant 1030 onto any of the heretofore presented partial semiconductor packages of the present invention (FIG. 2, FIG. 3A through FIG. 3D) then removing a top portion of the molding encapsulant 1030 till a first flat-top area 1034a and a second flat-top area 1034b of their corresponding stacked interconnection plates are exposed to maintain effective topside cooling. As a matter of course, various terminal leads 1006e, 1006f, 1006g, 1006h of a base leadframe 1002 are also exposed through the molding encapsulant 1030 for making external electrical connection. A bypass capacitor 1050, having two end capacitor terminals 1050a and 1050b located at its ends, is then stacked and bonded atop the two flat-top areas 1034a and 1034b. The bypass capacitor 1050 shown has end capacitor terminals 1050a and 1050b which wrap around the ends of the capacitor, however the terminals may alternatively only be located on the bottom side. As a preferred embodiment the bypass capacitor 1050 can be a surface mount device (SMD) style capacitor having a very compact outline. In this way, the bypass capacitor 1050 is now closely integrated atop the semiconductor package 1000a with reduced interconnection parasitic impedance (inductance and equivalent series resistance (ESR)). As a more specific example of application, the two semiconductor dies and the bypass capacitor 1050 of the semiconductor package 1000a can respectively be a high-side (HS) MOSFET, a low-side (LS) MOSFET and a bypass capacitor of a power-conversion circuit output stage.

Figure 5:
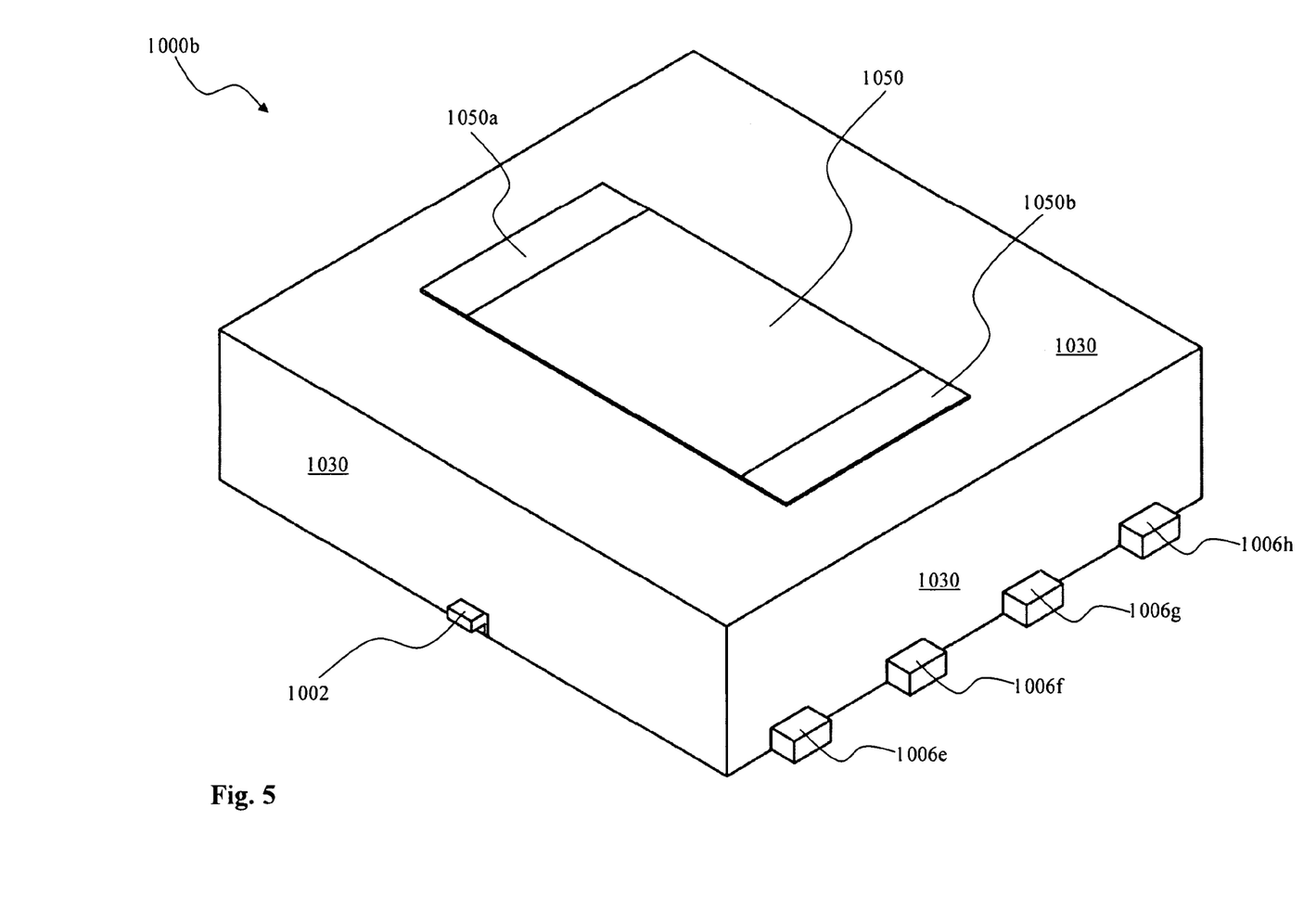
FIG. 5 illustrates an alternative compact semiconductor package of the present invention with a molding encapsulant.

FIG. 5 illustrates an alternative compact semiconductor package 1000b of the present invention with a molding encapsulant 1030. Here, a partial semiconductor package can be made by stacking and bonding the SMD style bypass capacitor 1050 atop the two flat-top areas 1034a and 1034b (not visible in this view) of any of the heretofore presented partial semiconductor packages of the present invention (FIG. 2, FIG. 3A through FIG. 3D). The molding encapsulant 1030 is then molded onto the package in progress followed by removing a top portion of the molding encapsulant 1030 till the top surface of the bypass capacitor 1050 is exposed. Comparing with the semiconductor package 1000a of FIG. 4B, while the bypass capacitor 1050 is now more robustly embedded in the semiconductor package 1000b with better overall package seal, the semiconductor package 1000b does offer correspondingly less effective top-side cooling.

To those skilled in the art, by now it should become clear that, albeit being desirable, to practice the present invention compact semiconductor package with integrated bypass capacitor does not absolutely require the stacked interconnection plates in the package. Take for example the partial semiconductor package 600 of FIG. 3A, in the absence of the stacked interconnection plates 630a and 630b one just needs to insure that each of the intimate interconnection plates 626a and 626b has a flat-top area, respectively similar to the first flat-top area 634a and the second flat-top area 634b, leveled with each other for integrally bonding the bypass capacitor. Also, within the context of the present invention, the circuit substrate, instead of being a leadframe, can be a laminated circuit having numerous terminal leads for making external electrical connection. However, to insure effective bottom-side heat dissipation, the laminated circuit should include a plurality of thermal vias. Furthermore, each of the semiconductor dies 620a and 620b can be normally oriented with its substrate down or oriented upside down in a flip-chip configuration. To maximize the numerous benefits of the present invention, the following lists some guidelines for the selection of material properties:

The circuit substrate should be thermally and electrically conductive, the intimate interconnection plates should be thermally and electrically conductive, and the stacked interconnection plates should be thermally conductive or thermally and electrically conductive.

With reference made to FIG. 3A, FIG. 4A and FIG. 4B as an illustrative example, a method of packaging the present invention semiconductor package 1000a includes:

a) Providing a leadframe 602 having numerous terminal leads 606a, 606b, 606f, 606g, 606h for external electrical connection. To implement a package pin out geometry that is compatible with an industry standard, for example, an industry standard DFN lead frame should be used here. A bonding agent is then dispensed atop leadframe die pads and the numerous terminal leads. The bonding agent can be made of a solder paste, a thermal and/or electrically conductive epoxy, etc. and it can be thermally or UV (ultra violet) curable.

b) Attaching two semiconductor dies 620a and 620b atop the leadframe die pads of the leadframe 602. More specifically, both semiconductor dies 620a and 620b can be attached to the leadframe 602 via solder as in a standard die attachment procedure. Solderable top metal should be used on the semiconductor dies 620a and 620b. For example, exposed Aluminum in the top source and gate pad regions of a MOSFET die should be electrolessly plated with NiAu.

c) Attaching intimate interconnection plates 626a and 626b respectively to the top contact areas of the semiconductor dies 620a and 620b and the leadframe 602 for electrical connection between the top contact areas and the numerous terminal leads 606a, 606b, 606f, 606g, 606h. More specifically, the attachment can be done via solder die attach. Similarly, an intimate interconnection plate three 626c can be simultaneously attached to another top contact area of semiconductor die one 620a and the terminal lead 606a. A bonding agent is then dispensed atop the intimate interconnection plates 626a and 626b.

d) Attaching stacked interconnection plates 630a and 630b respectively atop the intimate interconnection plates 626a and 626b. More specifically, the attachment can be done via solder attach. Alternatively, an electrically and thermally conductive epoxy can be used for the attachment. The package in progress is then treated to activate the various bonding agents thus forming a permanent bond between the stacked interconnection plates 630a, 630b and the intimate interconnection plates 626a, 626b. The package treatment can involve using heat, UV, etc. to reflow a solder paste or to cure an epoxy. Importantly, the various related semiconductor die thicknesses, plate thicknesses and bonding agent thicknesses should be chosen to insure that the second flat-top area 634b is in level with the first flat-top area 634a.

e) Molding a molding encapsulant 1030 over the package in progress.

f) Removing a top portion of the molding encapsulant 1030 till the two flat-top areas of the stacked interconnection plates 630a and 630b are exposed. More specifically, mechanical grinding can be employed for the removal.

g) Stacking then bonding the bypass capacitor 1050 atop the two stacked interconnection plates 630a and 630b via the two flat-top areas.

As already mentioned above, for making the alternative compact semiconductor package 1000b of FIG. 5 the above steps e) through g) should be replaced by:

Stacking and bonding the SMD style bypass capacitor 1050 atop the two flat-top areas 1034a and 1034b of the package in progress, molding a molding encapsulant 1030 over the package in progress then removing a top portion of the molding encapsulant 1030 till the top surface of the bypass capacitor 1050 is exposed.

A compact semiconductor package with intimate interconnection plates, stacked interconnection plates and an integrated bypass capacitor is proposed for packaging semiconductor dies with reduced die-to-terminal electrical resistance, die-to-ambient thermal resistance and interconnection parasitic impedance of the bypass capacitor at the same time. By now it should become clear to those skilled in the art that the numerous embodiments just described can be readily modified to suit other specific applications as well. While the description above contains many specificities, these specificities should not be construed as accordingly limiting the scope of the present invention but as merely providing illustrations of numerous presently preferred embodiments of this invention. For example, the present invention semiconductor package system expects to be applicable to the packaging of a wide variety of semiconductor dies other than just MOSFET dies as disclosed herein. These semiconductor dies include IGBT and dies made of SiGe, SiC, GaAs and GaN. For another example, the present invention can be extended to employ multiple layers of stacked interconnection plates as well.

Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

What is claimed are:

1. A method of packaging a semiconductor package having a bypass capacitor plus a number of semiconductor dies interconnected with a plurality of elevation-adaptive intimate interconnection plates and elevation-adaptive stacked interconnection plates, the method comprises:

a) providing a circuit substrate having a plurality of terminal leads for external electrical connection;

b) providing the semiconductor dies and attaching them atop the circuit substrate;

c) providing and attaching the plurality of intimate interconnection plates to the top contact areas of said semiconductor dies and said circuit substrate for electrical connection between said top contact areas and said terminal leads;

d) providing and attaching the plurality of stacked interconnection plates atop a selected number of intimate interconnection plates while insuring that a first member of the stacked interconnection plates has a first flat-top area and a second member of the stacked interconnection plates has a second flat-top area in level with the first flat-top area;

d1) molding a first encapsulant over the package in progress;

d2) removing a top portion of the first encapsulant till the top surfaces of the first flat-top area and the second flat-top area are exposed;

e) providing a bypass capacitor having two end capacitor terminals, stacking then bonding the bypass capacitor atop the two stacked interconnection plate members via the first flat-top area and the second flat-top area; and     f) molding a second encapsulant over the package in progress with the exception of exposing the top surface of the bypass capacitor.

2. The method of claim 1 wherein molding a second encapsulant further comprising:

f1) placing a detachable mask over the top surface of the bypass capacitor;

f2) molding an encapsulant over the package in progress; and     f3) removing the detachable mask from the package in progress to expose the top surface of the bypass capacitor to maintain effective top-side cooling.

3. The method of claim 1 wherein said circuit substrate is a leadframe and providing the circuit substrate further comprises dispensing a bonding agent atop the leadframe die pads and leadframe leads.

4. The method of claim 1 wherein providing and attaching the plurality of stacked interconnection plates further comprising:

d1) dispensing a bonding agent atop a selected number of said plurality of intimate interconnection plates for connecting the stacked interconnection plates with the intimate interconnection plates; and     d2) treating the package in progress to activate the bonding agent thus forming a permanent bond between the stacked interconnection plates and the selected intimate interconnection plates.

\* \* \* \* \*